March 28, 1967 S. E. BEALE 3,311,863

PRINTED CIRCUIT BOARD HARDWARE

Filed May 25, 1964 3 Sheets-Sheet 1

INVENTOR.
STANLEY E. BEALE
BY
Christie, Parker & Hale
ATTORNEYS.

March 28, 1967 S. E. BEALE 3,311,863

PRINTED CIRCUIT BOARD HARDWARE

Filed May 25, 1964 3 Sheets-Sheet 2

INVENTOR.
STANLEY E. BEALE

BY Christie, Parker & Hale
ATTORNEYS.

March 28, 1967 S. E. BEALE 3,311,863
PRINTED CIRCUIT BOARD HARDWARE
Filed May 25, 1964 3 Sheets-Sheet 3

INVENTOR.
STANLEY E. BEALE
BY
Christie, Parker & Hale
ATTORNEYS.

United States Patent Office 3,311,863
Patented Mar. 28, 1967

3,311,863
PRINTED CIRCUIT BOARD HARDWARE
Stanley E. Beale, Bradbury, Calif., assignor, by mesne assignments, to Scanbe Manufacturing Corporation
Filed May 25, 1964, Ser. No. 369,687
7 Claims. (Cl. 339—45)

This invention relates to hardware for printed circuit boards.

Modular electronic units are essentially building blocks for electronic devices such as computers and the like, and by interconnecting the modular units in a certain logical order, a complete electronic device may be constructed. Most modular electronic units have interconnecting pluggable elements supporting electronic components connected by printed circuit boards.

Most modular electronic units have a series of printed circuit cards or boards that are stacked in side by side relationship within a receptacle and inserted within individual electrical connections mounted in the receptacle. Guiding elements receive the printed circuit board and allow individual circuit boards to be removed for maintenance and test purposes. U.S. Patent 3,017,232, granted on Jan. 16, 1962, to H. Schwab et al., is an example of an electronic unit which is especially adapted for modular construction of the printed circuit boards.

The electrical coupling between the electrical connector of the receptacle and terminals of the circuit boards are established by mechanical pressure. The electrical connector has contacts that are flexible and spring biased to exert a relatively high degree of pressure upon the associated terminals of the pluggable circuit boards. Since electrical resistance between the connector and the circuit board terminals is largely a function of the pressure applied thereto, it is highly desirable to have the connector contacts bear against the circuit board terminals with a relatively high pressure so as to keep the electrical resistance relatively low.

It has been found in practice that in installations such as high speed aircraft, missiles and the like, extremely high gravitational forces, vibration, and mechanical shock are prime considerations and cause the circuit board to become disengaged from the connector.

Thus it is considered essential that in order for printed circuit boards to be used in modular electronics units, the boards must be rigidly retained within the electrical conductors and be able to be subjected to relatively large amounts of mechanical vibration and shock without being dislodged from the modular receptacle.

In the prior art modular electronics units, an ejector was commonly used on each printed circuit board such that rotation, of the ejector against the side of the receptacle, would provide some semblance of rectilinear motion to force the board from engagement with the electrical connector. These prior ejectors have been totally inadequate in preventing the disengagement of the circuit board from the connector under extreme conditions of vibration and shock. Also, the configuration of the prior art ejectors have not been wholly adequate to allow the removal of the circuit board from the receptacle with a minimum of energy expended upon the board. Especially in modular units in which the electrical connector exerts an especially high contact pressure against the circuit board terminal, the boards are then quite difficult to remove and have been accidentally broken or fractured during the removal of the board.

The present invention provides an improved ejector which allows maximum contact pressure to be exerted between the electrical connector and the circuit board and provide relatively low electrical resistance. One aspect of my invention includes a latching lever which functions not only to prevent removal of the circuit board, but also aids in the removal of the board with a minimum of effort.

In terms of structure, the hardware for a circuit board includes an ejector which is pivotally mounted upon the circuit board and a latching lever which is pivotally mounted to the ejector. A spacer is disposed adjacent to the ejector and lever and an ear disposed upon the latching lever in such a position that with the lever in a first position the ear engages the spacer to prevent the removal of the circuit board. Upon further rotation of the lever, the ear engages the upper surface of the spacer to provide a sliding contact which allows the ejector to pivot with relation to the circuit board and facilitate the removal of the board.

These and other features of my invention will become readily apparent after consideration of the specification and drawings in which.

Figure 1:
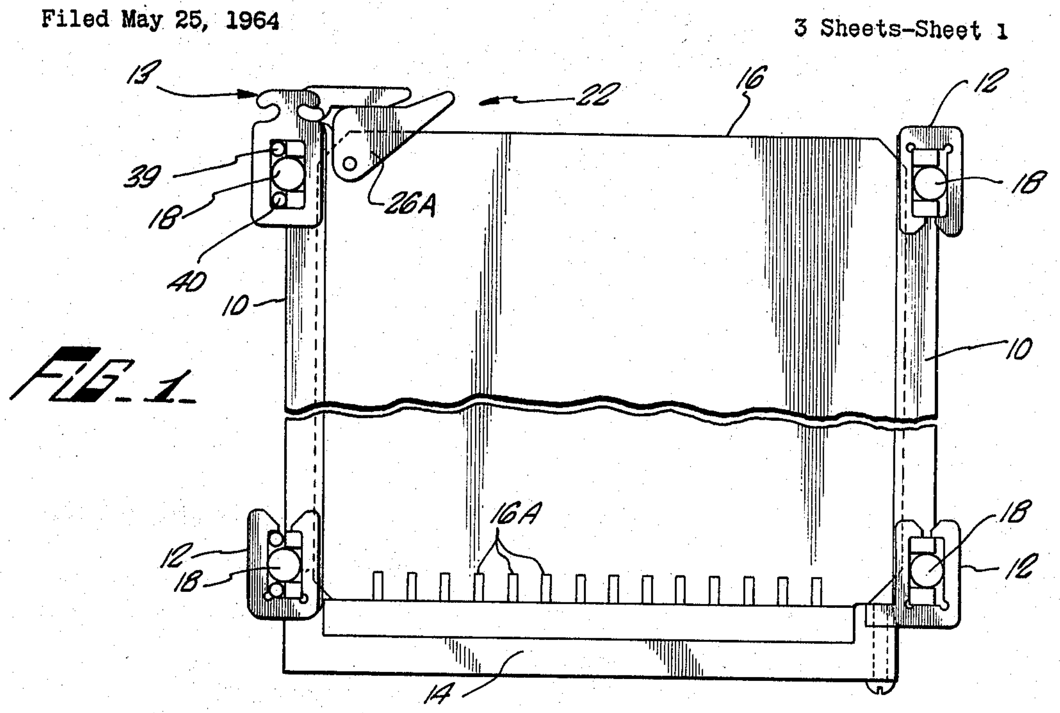
FIG. 1 is a side elevation of a portion of a modular subassembly including an ejector constructed according to the present invention.

The present invention will be best understood by first considering the environment in which it is used and as is illustrated in FIG. 1. Basically, the modular hardware used with the present invention includes a pair of guiding elements 10, a locking element 12, and an electrical connector 14 used with a printed circuit board 16. These modular elements are clamped or snapped to holding elements shown as rods 18, as best described in the aforementioned Schwab et al. patent. An ejector 22 constructed according to the present invention is pivotally mounted on the circuit board 16 and is used basically for the removal of the circuit board 16 from the frictional engagement with the electrical connector 14.

The conventional electrical components usually mounted on the circuit board 16 are not illustrated except for electrical terminals 16A disposed adjacent the lower edge of the circuit board 16. The conventional electrical connector 14 is commercially available and receives the lower edge of the circuit board 16 whereby the printed circuit portions (not shown) are aligned with respective electric circuit terminals within the connector 14.

The guiding elements 10 are disposed on opposite sides of the circuit board 16 and include a longitudinal slot or track extending along its length for purposes of guiding the vertical movement of the circuit board. The locking elements 12 are disposed between each guiding element 10 to establish the position of adjacent circuit boards 16 and guiding elements 10. A plurality of spacers 13 somewhat similar in configuration to the locking elements 12 are disposed upon the holding element 18 and operate in combination with the ejector 20 on each circuit board 16.

To remove a circuit board 16, the ejector 22 is rotated to forcibly withdraw the electrical terminals 16A from the connector 14. Thereafter the circuit board may easily be guided between the guide elements 10 and removed.

Figure 2:
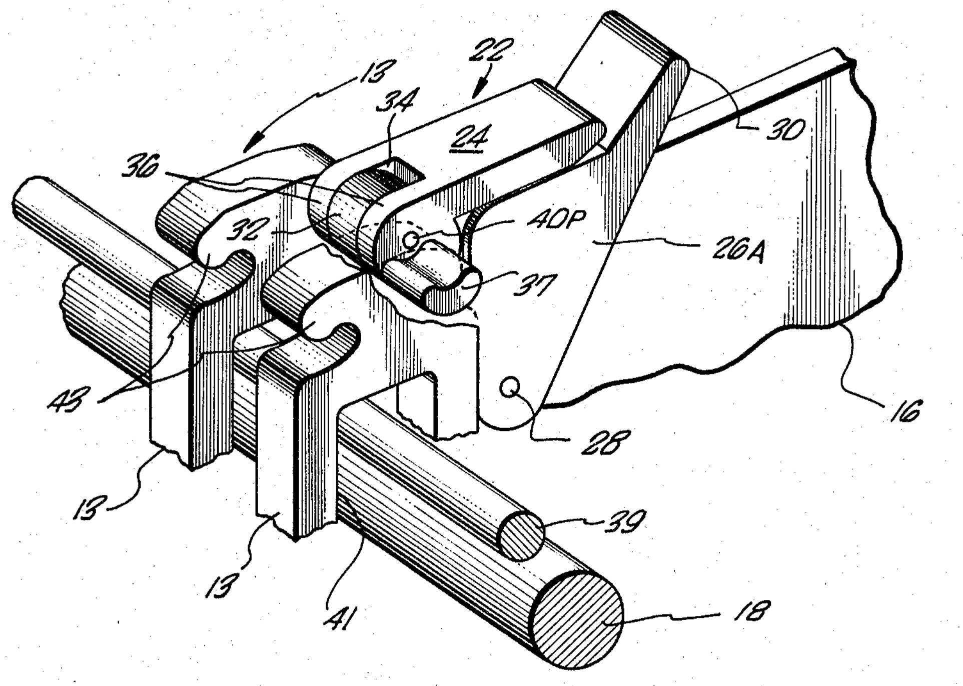
FIG. 2 is an enlarged perspective view illustrating an ejector constructed according to the present invention and ilustrated in the closed position.
Figure 3:
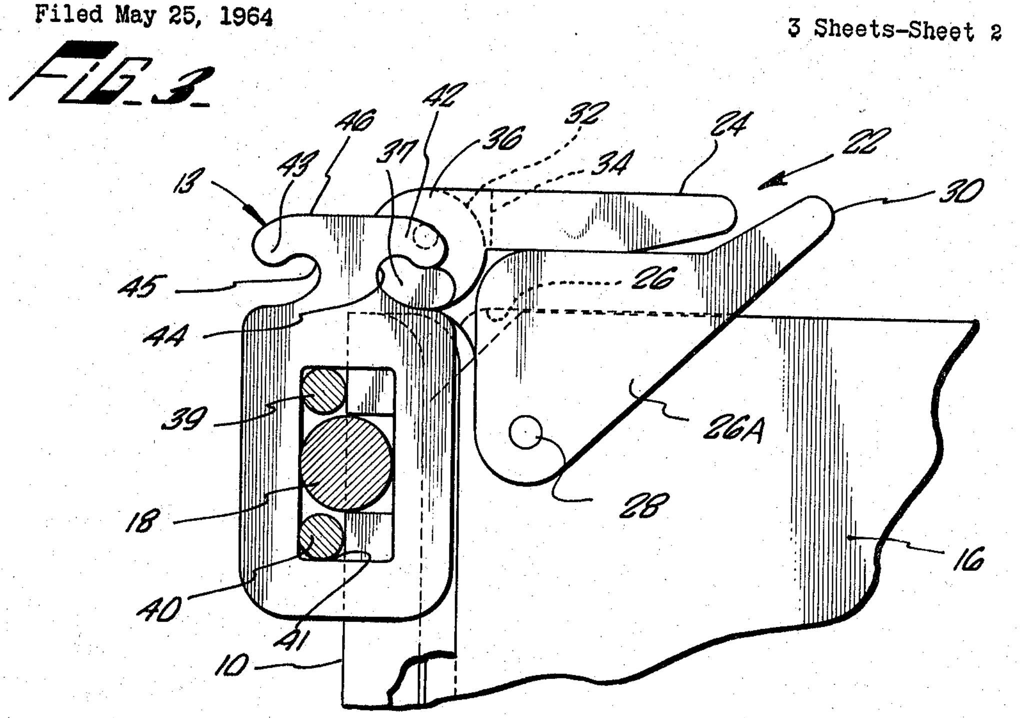
FIG. 3 is a front elevation of an ejector according to the invention and illustrated in the closed position.
Figure 4:
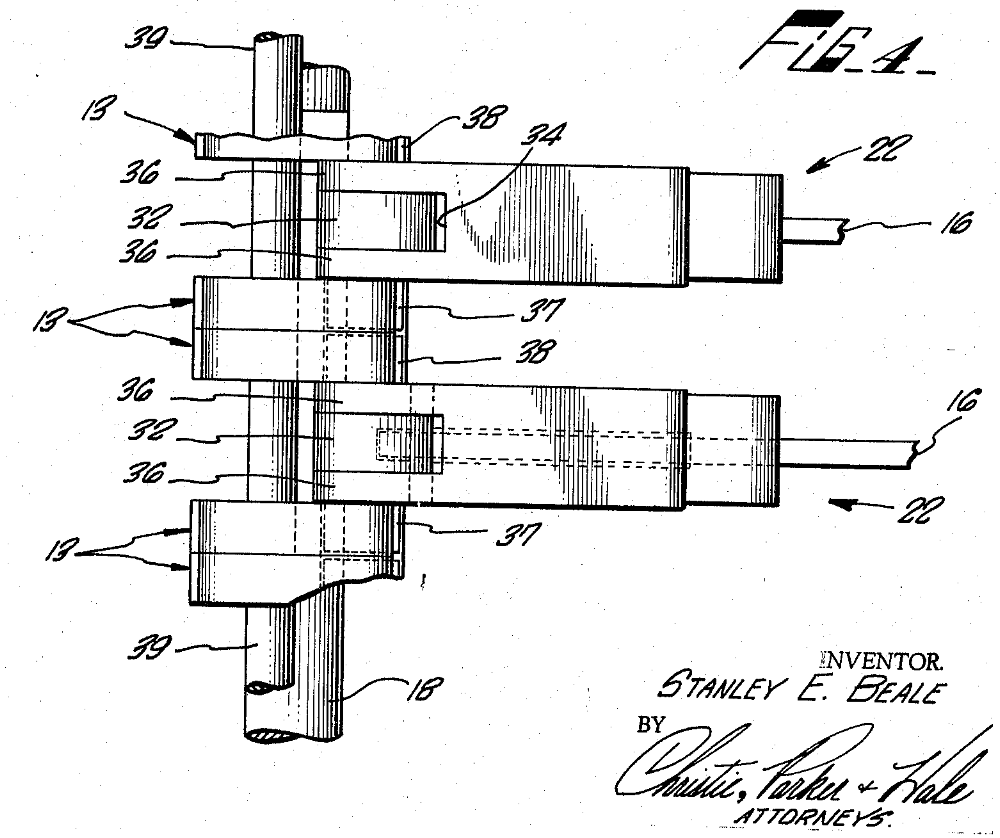
FIG. 4 is a plan view of the ejector mounted on a circuit board and illustrated in the closed position.
Figures 5, 6:
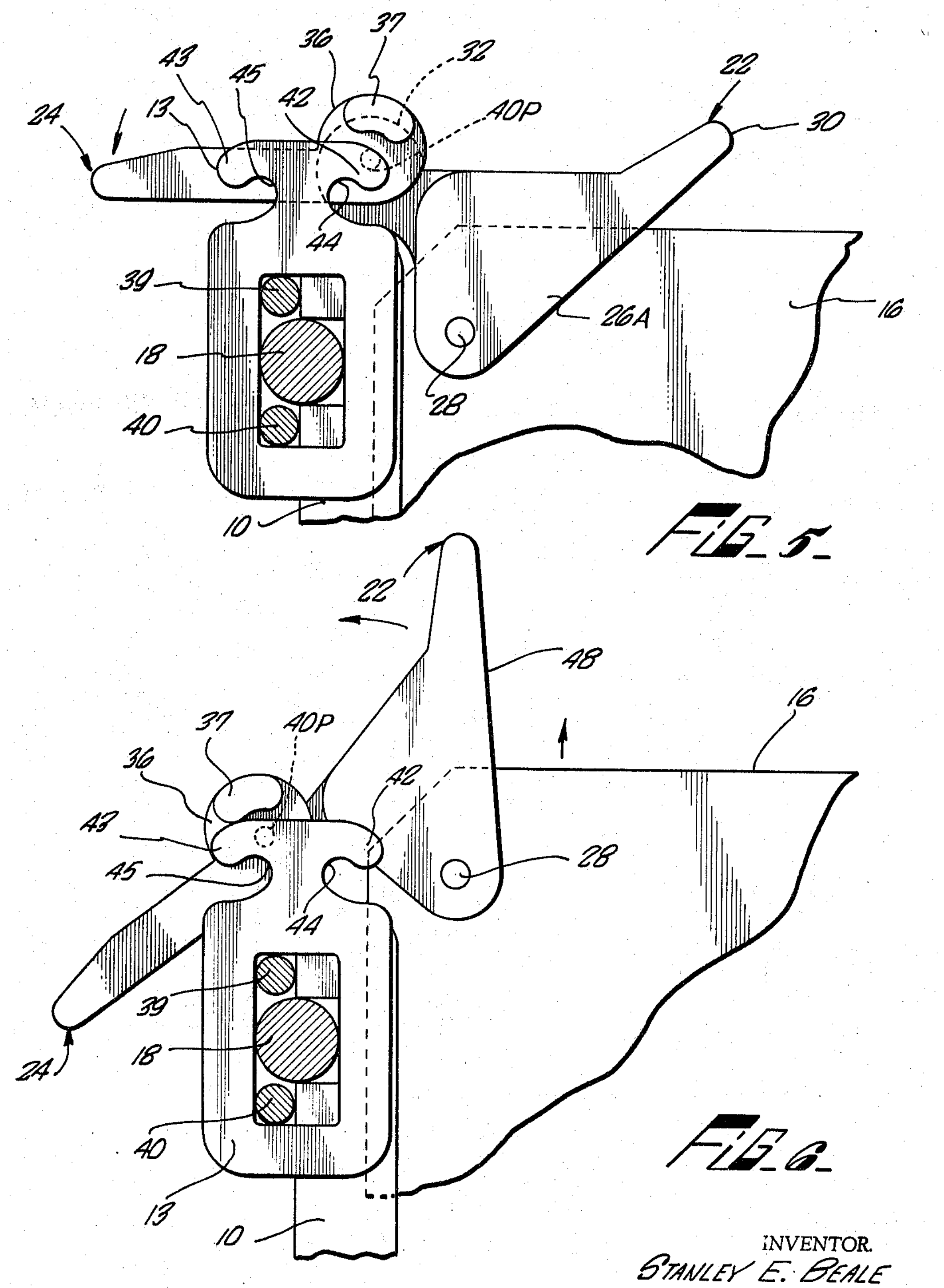
FIG. 5 is a front elevation of the ejector illustrated in FIG. 3 with the locking lever rotated through an angle of 180°.
FIG. 6 is a front elevation illustrating the ejector of FIG. 5 being pivoted to a maximum position such that the circuit board is released and may be removed.

Referring now to FIGS. 2, 3, and 4, the ejector 22 is pivotally mounted upon the circuit board 16 and a pivotal latching lever 24 is rotatably mounted on the ejector 22 and arranged between a pair of spacers 13. The ejector 22 is preferably fabricated from a plastic such as nylon, and which may be formed by means of an injection molding process. The ejector 22 is roughly triangular in shape and has a slot 26 extending along its length forming a pair of bifurcated leaves 26A which are disposed on either side of the circuit board 16. A pin 2 passes through each of the bifurcated leaves 26A and the circuit board 16 to allow the ejector 22 to pivot with relation to the circuit board 16 as illustrated in FIG. 6.

At one end of the ejector 22 is obliquely disposed an upwardly extending finger 30 which allows an operator to insert his finger between the ejector 22 and the circuit board 16 such that the board may be removed in a manner to be described hereinafter.

An arcuately shaped head portion 32 extends obliquely with relation to the circuit board 16 and is preferably integrally formed with the ejector 22. The head portion 32 has a width which is substantially the same size as the slot 34 formed in the pivoting lever 24. The latching lever 24 has as one end thereof an arcuately shaped bifurcated head 36 which extends on opposite sides of the head portion 32 on ejector 22. A pair of integrally formed arcuately shaped ears 37, 38, extend outwardly from the latching lever 24 substantially at right angles to the lever and to the sides of the ejector 22. A centrally located pin 40 passes through both the latching lever 24 and the ejector 22 and acts as an axis of rotation for both elements.

The pair of spacers 13 are disposed upon the rod 18 and a pair of pins 39, 40 which are located in opposite corners of the rectangularly shaped opening 41. The pins 39 and 40 are provided to assure vertical alignment of the spacers 13. The rod 18 and pins 39, 40 are supported by end brackets (not shown). The pin 40 lies close to the flat surface 41 of spacer 13. The sides of spacers 13 are located very closely to the sides of the bifurcated head portion 36 on the latching lever. The spacers 13 are preferably fabricated from resilient plastic such as nylon and may be formed by means of an injection molding process. A pair of symmetrically shaped knobs 42, 43, are disposed on opposite ends of the spacer and are generally arcuate in shape to mate in part with the arcuately shaped ears 37, 38. A pair of arcuately shaped grooves 44, 45 are formed beneath the respective knobs 42, 43 and closely mate the shape of their respective ears 37, 38, which are normaly disposed therein when the latching lever 24 is in the closed position as illustrated in FIG. 3.

While the knob 43 and groove 45 perform no function in the embodiment illustrated, the spacer is shaped symmetrically, such that during assembly the spacer may be mounted upon the rod 18 in either direction tending not to confuse the assembler.

An important aspect of the invention is that the grooves 44 and 45 essentially function as sockets for the ears 37, 38 and are constructed and defined along with the flat upper surface 46 of the spacers 13 to allow the ears 37, 38 to ride out of the sockets and along the flat surfaces 46 in response to the swinging of the latching lever 24 to a non-latching position.

Referring now to all the figures, the operation of removing the circuit board 16 from the modular hardware will now be described in detail. The latching lever 24 is pivoted counterclockwise about pin 40P, from its locked position as illustrated in FIGS. 1–4, until the ears 36, 37, assume the position illustrated in FIG. 5 with the latching lever rotated approximately 180°. It should be noted that with the latching lever 24 disposed in the closed position as illustrated in FIGS. 2–4, the circuit board 16 is not removable and cannot be vibrated loose from the modular hardware since the ears 37, 38 are in a latched position beneath the knobs 42 on each spacer 13. Upon further rotation of latching lever 24, the lever passes between spacers 13 and an operator's finger is inserted between the ejector 22 and circuit board 16 to pivot the ejector 22 counterclockwise until a surface 48 on the bifurcated leaves 26A assumes the position vertical with respect to the top surface of circuit board 16, as shown in FIG. 6. During this rotational motion of ejector 22, the electrical conductors 16A on the circuit board 16 are forcibly withdrawn from the connector 14 and the ears 37, 38 and provide a sliding pivot point on the flat surface 46 on each respective spacer 13. Thereafter the circuit board and the ejector may be withdrawn from the modular hardware.

The circuit board 16 may be reinserted by placing it between the guiding elements 10 and forcing it downwardly until the electrical conductors 16A enter the connecter 14 to assume a lowermost position. At this point the relative position of the ejector 22 and the latching lever 24 is similar to that as illustrated in FIG. 5. Lever 24 is rotated until the ears 37, 38 are disposed beneath the knobs 42 on each respective spacer 13 until each respective ear mates within the arcuately shaped groove 44 and thereby locks the structure in the correct position as shown in FIGS. 1 through 4. In the latched or locked position therein illustrated, it can be seen that rotation of ejector 22 by means of finger 30 is blocked by reason of this interlock between ears 37, 38 and grooves 44, noting that ears 37, 38 are integral with bifurcated head 36 pivotally mounted on head portion 32 which is, in turn, integral with finger 30.

It should now be evident that the present invention has advanced the art through the provision of hardware for circut boards to be used in conjunction with modular hardware and which hardware prevents movement of the circuit board relative to the electrical connector and aids in the removal of the circuit board when desired.

What is claimed is:

1. Modular hardware for mounting circuit boards and the like comprising:
   - a pair of circuit board guiding and mounting elements each having a longitudinal track defined on one side thereof and mounted to slidably receive and secure a circuit board therein,
   - an electrical connector mounted to slidably receive and secure a circuit board from said mounting elements,
   - a circuit board mounted between said mounting elements and arranged in electrical engagement with the electrical connector,
   - said circuit board including a circuit board ejector pivotally mounted adjacent a corner of the board spaced opposite the end received by the electrical connector,
   - said ejector being defined with an outwardly extending protrusion,
   - said ejector including a latching element having a pair of latching ears defined to extend outwardly on opposite sides of the latching element and being pivotally mounted to said ejector protrusion to alternately lock the circuit board into the electrical connector and to swingably unlock the circuit board therefrom to allow the ejector to be swung about its pivot for ejecting the circuit board from the electrical connector, and
   - means mounted adjacent the mounting element adjacent said ejector for securing the latching ears to thereby maintain the latching element in a latching position and defined to be responsive to the swinging of the latching element to a non-latching position to release the latching ears.

2. Modular hardware for mounting circuit boards and the like comprising:
   - a pair of circuit board guiding and mounting elements each having a longitudinal track defined on one side thereof and mounted to slidably receive and secure a circuit board therein, an electrical connector mounted to slidably receive and secure a circuit board from said mounting elements, a circuit board mounted between said mounting elements and arranged in electrical engagement with the electrical connector, said circuit board including a circuit board ejector pivotally mounted adjacent a corner of the board spaced opposite the end received by the electrical connector, said ejector being defined with an outwardly extending protrusion, said ejector including a latching element having a pair of arcuate latching ears defined to extend outwardly on opposite sides of the latching element and pivotally mounted to said ejector protrusion to alternately lock the circuit board into the electrical connector and to swingably unlock the circuit board therefrom to allow the ejector to be swung about its pivot for ejecting the circuit board from the electrical connector, a pair of clamping elements mounted adjacent said mounting elements and each having a clamping socket for securing the latching ears to thereby maintain the latching element in a latching position and defined to be responsive to the swinging of the latching element to a non-latching position to release the latching ears whereby the latching ears move out of the sockets to a non-latching position on the clamping elements.

3. Modular hardware for mounting circuit boards and the like as defined in claim 2 wherein the clamping elements are defined with a flat surface adjacent the clamping sockets to allow the latching ears to ride out of the clamping socket and onto and along the flat surfaces to a non-latching position whereby the ejector may be operated.

4. Hardware for a circuit board comprising:

a spacer, an ejector adapted to be mounted on a circuit board, a lever pivotally mounted on the ejector and having a first position in which the lever abuts the ejector, the lever and ejector have an axis of rotation about which the lever pivots, and an ear formed on the lever for extending into engagement with the spacer when the lever is in the first position and spaced from the lever axis of rotation, the spacer having a groove for receiving the lever ear, the spacer having an upper surface thereon at such a level that the lever ear engages the spacer upper surface with the lever in a second position at least 90° from the first position, upon rotation of the lever past the second position more than 90° from the first position the lever ear slides upon the spacer upper surface and the ejector is urged upwardly.

5. Modular hardware for mounting circuit boards and the like comprising:

a pair of circuit board guiding and mounting elements each having a longitudinal track defined on one side thereof and mounted to slidably receive and secure a circuit board therein, an electrical connector mounted to slidably receive and secure a circuit board from said mounting elements, a circuit board mounted between said mounting elements and arranged in electrical engagement with the electrical connector, said circuit board including a circuit board ejector pivotally mounted adjacent a corner of the board spaced opposite the end received by the electrical connector for engaging the supporting structure to eject the circuit board when pivoted thereagainst, said ejector including a latching element pivotally mounted therewith and being independently swingable, means associated with and mounted adjacent at least one of said mounting elements for latching engagement with said latching element to prevent the ejector from being pivoted and thereby the release of the circuit board when it is in engagement with the ejector latching element, said latching element and said means being constructed and defined relative to one another for latching and independently coacting in accordance with the independent swinging action of the latching element to latch and release the circuit board relative to the electrical connector.

6. A latching printed circuit board ejector comprising an ejector adapted to be pivotally mounted adjacent an end of a circuit board for coaction with a supporting structure to be pivoted thereagainst for causing movement of the circuit board, said latching ejector including a latching element pivoted thereto and swingable to and from an ejector latching and unlatching position independently of the ejector proper to prevent the operation of the ejector and thereby latching the circuit board in an immovable position, said latching element being constructed and defined relative to the circuit board supporting structure to be latched thereto.

7. A latching printed circuit board ejector as defined in claim 6 including means mountable with the circuit board supporting structure for locking coaction with said latching element and allowing the ejector to be operated for ejecting the circuit board.

References Cited by the Examiner

UNITED STATES PATENTS

| | | | |
|---|---|---|---|
| 2,487,801 | 11/1949 | Healy | 339—91 |
| 2,993,187 | 7/1961 | Bisbing et al. | 339—75 X |
| 3,017,232 | 1/1962 | Schwab et al. | 339—176 |
| 3,150,906 | 9/1964 | Chambon et al. | 339—45 |

FOREIGN PATENTS

| | | |
|---|---|---|
| 687,866 | 2/1940 | Germany. |
| 1,151,580 | 7/1963 | Germany. |

OTHER REFERENCES

IBM Technical Disclosure Bulletin vol. 2, No. 3, October 1959, page 29.

EDWARD C. ALLEN, *Primary Examiner.*

PATRICK A. CLIFFORD, *Examiner.*